United States Patent [19]
Paek et al.

[11] Patent Number: 5,472,905
[45] Date of Patent: Dec. 5, 1995

[54] METHOD FOR FORMING A FIELD OXIDE LAYER OF A SEMICONDUCTOR INTEGRATED CIRCUIT DEVICE

[75] Inventors: Weon-sik Paek; Taek-yong Jang; Weon-taek Choi, all of Seoul, Rep. of Korea

[73] Assignee: Samsung Electronics Co., Ltd., Kyunggi-do, Rep. of Korea

[21] Appl. No.: 674,238

[22] Filed: Mar. 25, 1991

[30] Foreign Application Priority Data

Nov. 17, 1990 [KR] Rep. of Korea ............... 90-18656

[51] Int. Cl.⁶ ............................................. H01L 21/76
[52] U.S. Cl. ........................... 437/70; 437/69; 437/72; 437/968
[58] Field of Search ........................... 437/70, 69, 72, 437/968

[56] References Cited

U.S. PATENT DOCUMENTS 4,897,364  1/1990  Nguyen et al. ............. 437/69

FOREIGN PATENT DOCUMENTS

| | | | |
|---|---|---|---|
| 232143 | 10/1987 | Japan | 437/70 |
| 302536 | 12/1988 | Japan | 437/70 |
| 98246 | 4/1989 | Japan . | |
| 256147 | 10/1989 | Japan | 437/70 |
| 0282839 | 11/1989 | Japan . | |
| 2198882 | 6/1988 | United Kingdom | 437/70 |

Primary Examiner—Brian E. Hearn
Assistant Examiner—Trung Dang
Attorney, Agent, or Firm—Rothwell, Figg, Ernst & Kurz

[57] ABSTRACT

A method for forming a field oxide layer of a highly integrated semiconductor device comprises the steps of depositing a pad oxide layer and a nitride layer over a substrate, removing the nitride layer over a field region, forming spacers on the side walls of the remaining nitride layer, doping an impurity into the field region using the spacers as a mask, thermally oxidizing the substrate exposed in the field region, growing the field oxide layer, and planarizing the upper portion of the field oxide layer by an etchback process, thereby reducing the step coverage problem of the field oxide layer.

Therefore, the size of bird's beak and stress can be reduced at the edges of the field region. The heavily doped channel stop layer is formed only in the middle section of the field region, thereby preventing the lowering of the breakdown voltage and punch-through.

4 Claims, 8 Drawing Sheets

5,472,905

METHOD FOR FORMING A FIELD OXIDE LAYER OF A SEMICONDUCTOR INTEGRATED CIRCUIT DEVICE

FIELD OF THE INVENTION

The present invention relates to a method for isolating integrated circuit, from each other in a semiconductor device, and particularly to a method for forming a field oxide layer capable of preventing lateral expansion in the LOCOS method and for improving step coverage.

BACKGROUND OF THE INVENTION

In recent years, along with the trend for achieving higher packing density in integrated circuit semiconductor devices, active research and development in the field of isolation techniques has been in progress, striving for device miniaturization. Therefore, isolation regions, which are necessary to prevent current flow between bipolar devices on a single substrate, taking up a considerable portion of a chip, should be reduced in order to proportionally shrink the size of the semiconductor devices over the whole chip pattern.

Conventionally, the LOCOS (LOCal Oxidation of Silicon) method has been generally utilized as one of the isolation techniques for forming isolation regions on a substrate.

The conventional process for forming a field oxide layer by the LOCOS method is explained with reference to FIGS. 1A to 1D. In FIG. 1A, a pad oxide layer 2 is formed over a silicon substrate 1, and a non-oxidizable silicon nitride layer 3 is then formed thereon. Whereafter, as shown in FIG. 1B, a photoresist 4 is applied on the nitride layer 3, and channel stop regions 7 are formed by ion implanting an impurity of the same conductivity type as that of the silicon substrate 1. As shown in FIG. 1C, after removing the photoresist 4, field oxide layers 5 are formed by oxidation for defining an isolation region. Finally, the isolation region as shown in FIG. 1D is formed by removing the nitride layer 3 and the pad oxide layer 2.

The main characteristic of the aforesaid method is that the impurity is doped to form the channel stop layer on the isolation region by self-alignment which is used as a technique for mass production of semiconductor devices commonly designed on a 1 μm grid.

However, it is the principle problem of the method that a portion of the field oxide layer called a "bird's beak" intrudes into the active element regions from the isolation region during selective oxidation, causing the isolation region to have an increased size. Although reduction of the bird's beak region can be achieved by making the field oxide layer a thin film, the thin-filming of the field oxide layer restricts miniaturization in the sub-micron region.

Accordingly, methods of forming isolation regions which reduce the bird's beak size have been actively studied in recent years.

One approach of the studies is the improvement of a selective oxide layer, and SWAMI (Side Wall Masked Isolation) and SEPOX (SElective Polysilicon OXidation) can be cited as the typical methods for the improvement. Another approach is to form a groove filled with an insulating material, and BOX (Buried OXide isolation) can be cited as the typical method thereof.

FIGS. 2A to 2D show the process for forming a field oxide layer manufactured by the SWAMI method.

Referring to FIG. 2A, after a first pad oxide layer 11 and a first nitride layer 12 of $Si_3N_4$ are formed over a silicon substrate 10, the first nitride layer 12 and the first pad oxide layer 11 are selectively etched. Successively, the exposed silicon nitride substrate 10 is etched to a predetermined depth. Thereafter, an impurity of the same conductivity type as that of the silicon substrate 10 is ion implanted into the exposed silicon substrate 10 by using the remaining nitride layer 12 as a mask, thereby forming a channel stop region 13. As illustrated in FIG. 2B, a second pad oxide film 14 is then grown on the exposed silicon substrate 10, and a second nitride layer 15 is deposited over the whole surface of the resultant structure. An oxide layer 16 is then thickly deposited thereon. As illustrated in FIG. 2C, spacers 17 are formed by anisotropically etching the oxide layer 16 and the second nitride layer 15 and to expose the first nitride layer 12. The field region is continuously oxidized to form a thick field oxide layer 18, as illustrated in FIG. 2D.

However, in the aforedescribed SWAMI method, the manufacturing process of the spacer 17 formed for preventing the formation of the bird's beak of the field oxide layer 18 is fastidious. Also, etching of the silicon substrate may create defects in the silicon substrate. In addition, since the channel stop region is impurity-doped before forming the spacer, it is disadvantageous in that the edge portions of the channel stop region may expand into the active region resulting in the lowering of the junction breakdown voltage of the device. Therefore, the impurities can not be heavily doped into the channel stop region.

FIGS. 3A to 3D show the process for forming a field oxide layer manufactured by the conventional SEPOX method.

Referring to FIG. 3A, a pad oxide layer 21 is grown by thermal oxidation on a silicon semiconductor substrate 20, and a polysilicon layer 22 and a nitride layer 23 are sequentially formed over the pad oxide layer 21. Referring to FIG. 3B, the nitride layer 23 is etched via reactive ion etching using a photoresist 24 as a mask, thereby forming a pattern. Thereafter, an impurity having the same conductivity type as that of the substrate is ion implanted through the polysilicon layer 22. Referring to FIG. 3C, the photoresist 24 is removed, and the exposed polysilicon layer 22 is thermally oxidized for forming field oxide layers 26. Referring to FIG. 3D, after the nitride layer 23 is removed, the unoxidized polysilicon layer 22 is etched via reactive ion etching. Referring to FIG. 3E, the leftover tips of polysilicon of the polysilicon layer 22 which remain from the previous step, are oxidized as in the SWAMI method, thereby planarizing the end portion of the field oxide layer.

However, in the aforedescribed SEPOX method, since a field oxide layer is formed by thermally oxidizing a polysilicon layer formed over a silicon substrate, it is disadvantageous in that the step coverage is degraded. In addition, since the channel stop region is formed to be self-aligned with the active region, the breakdown voltage of the channel stop layer is lowered. As a result, the channel stop layer cannot be heavily doped, and problems such as punchthrough have arisen.

SUMMARY OF THE INVENTION

Therefore, it is an object of the present invention to provide a method for forming a field oxide layer of semiconductor device, by which stresses at the edges of a field oxide layer are markedly decreased, and the detrimental intrusion of a bird's beak portion into an active region of a device can be reduced.

It is another object of the present invention to provide a method for forming a field oxide layer of a semiconductor device, by which step coverage is improved.

It is still another object of the present invention to provide a method for forming a field oxide layer of a semiconductor device, by which impurities can be heavily doped into a channel top layer.

To achieve these and other objects, a method for forming a field oxide layer according to the present invention comprises the steps of:

thermally growing a pad oxide layer on a semiconductor substrate, and depositing a nitride layer on the pad oxide layer;

removing the nitride layer over a field region to define active regions;

forming spacers on the side walls of the remaining nitride layer;

doping the field region with impurities using the spacers as a mask;

growing a field oxide layer by thermally oxidizing the exposed portion on the substrate in the field region;

removing the remaining nitride layer; and reducing the step coverage problem of the field oxide layer by an etchback process.

In an alternative to the above described method for forming a field oxide layer according to the present invention, a polysilicon layer is formed on the pad oxide layer, and is then thermally oxidized to form the field oxide layer. Therefore, as compared with the direct oxidizing method of the silicon substrate, the formation of the bird's beak can be effectively controlled by thermally oxidizing the polysilicon layer.

BRIEF DESCRIPTION OF THE DRAWINGS

The present invention will be described by way of an embodiment with reference to the attached drawings, in which.

DETAILED DESCRIPTION OF THE INVENTION

FIGS. 4A to 4I show one embodiment of a process for forming a field oxide layer according to the present invention.

Figure 1A:
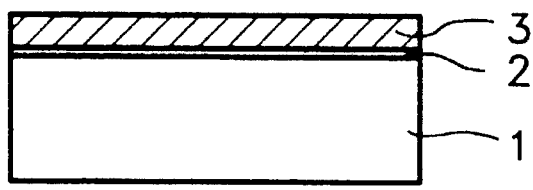
FIGS. 1A to 1D show a process for forming a field oxide layer by the conventional LOGOS method.
Figure 1B:
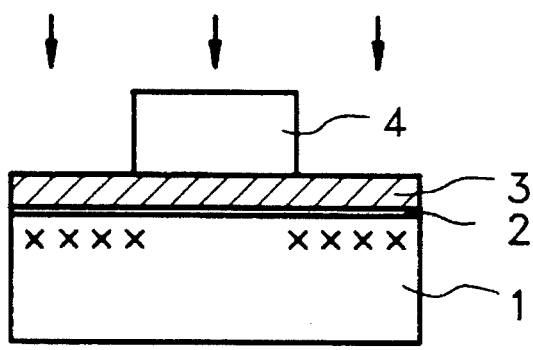
Figure 1C:
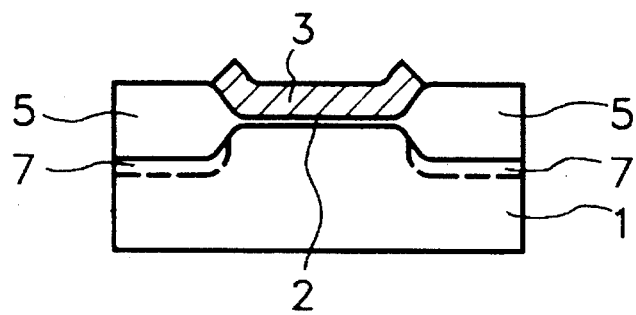
Figure 1D:
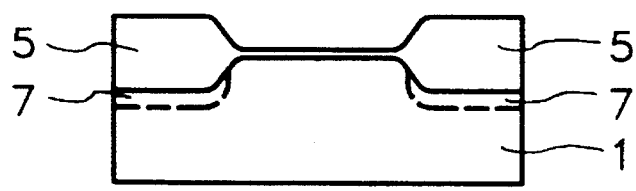
Figure 2A:
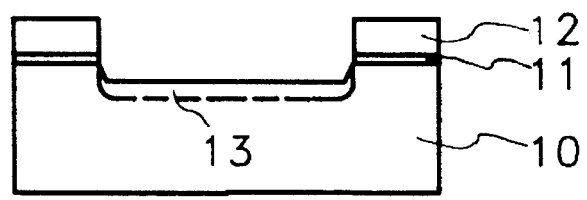
FIGS. 2A to 2D show a process for forming a field oxide layer by the conventional SWAMI method.
Figure 2B:
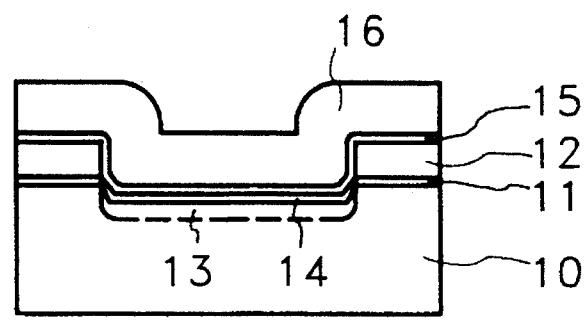
Figure 2C:
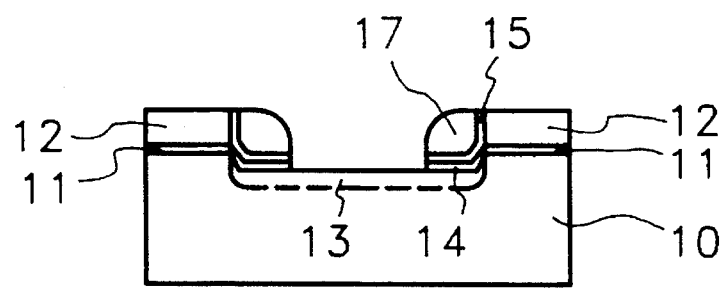
Figure 2D:
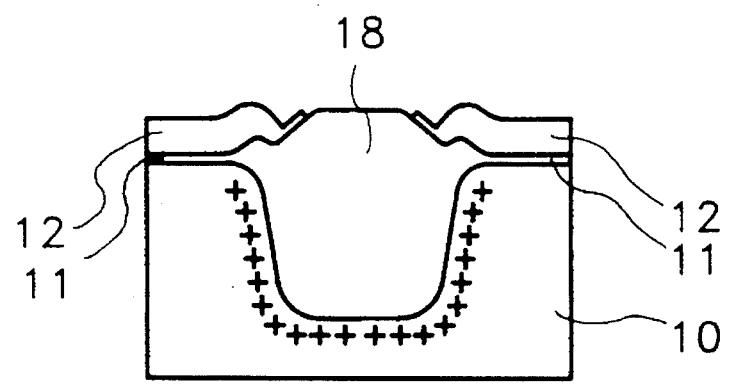
Figure 3A:
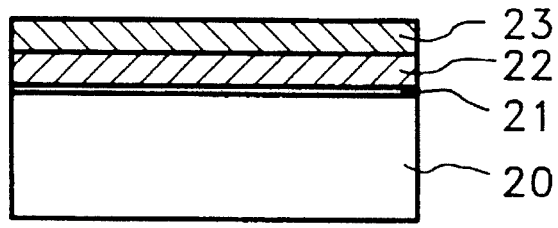
FIGS. 3A to 3E show a process for forming a field oxide layer by the conventional SEPOX method.
Figure 3B:
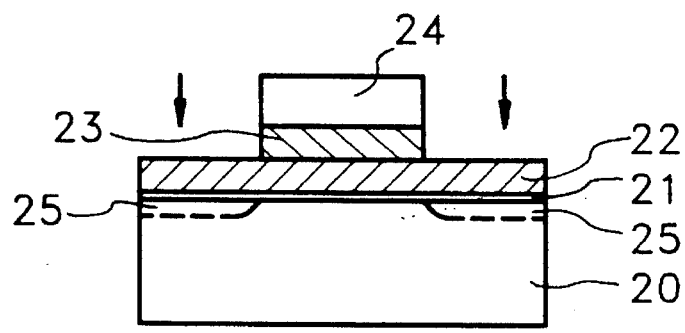
Figure 3C:
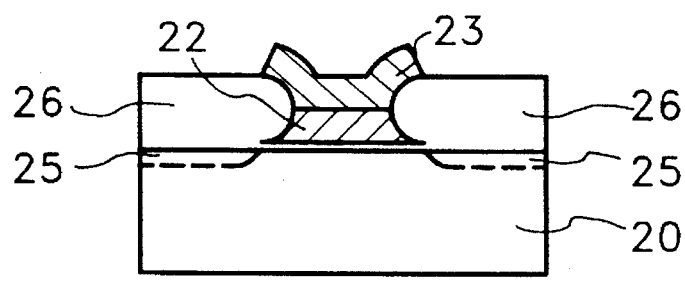
Figure 3D:
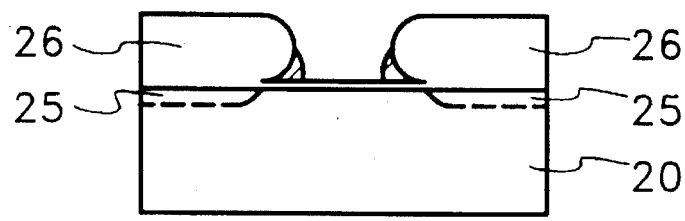
Figure 3E:
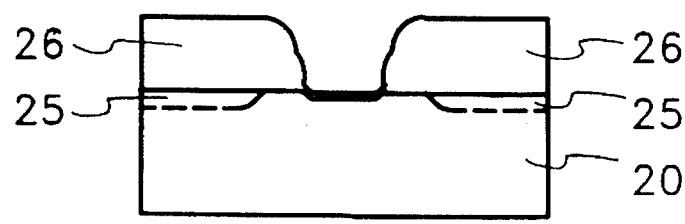
Figure 4A:
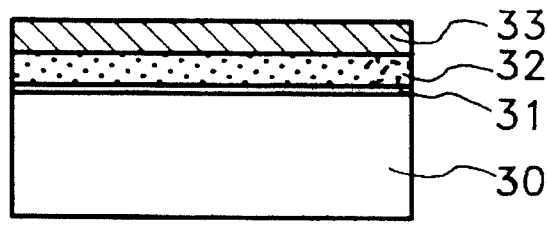
FIGS. 4A to 4I show one embodiment of a process for forming a field oxide layer according to the present invention.

FIG. 4A illustrates a process for forming a pad oxide layer 31, a polysilicon layer 32 and a nitride layer 33. The pad oxide layer 31 having a thickness of about 80 Å to 1000 Å is grown via thermal oxidation on a silicon substrate 30. Then, the polysilicon layer 32 and nitride layer 33 having a thickness of about 1000 Å to 4000 Å are sequentially formed by CVD (Chemical Vapor Deposition) over the pad oxide layer 31.

Figure 4B:
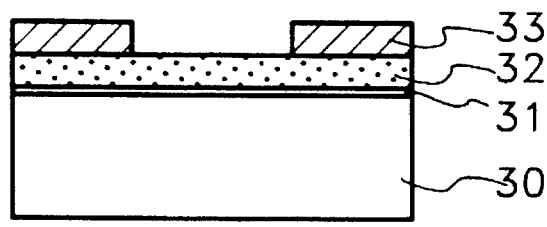

FIG. 4B illustrates a process for forming an opening, wherein the nitride layer 33 is selectively etched by a photolithography process so as to define an isolation region for isolating devices from each other, whereby the nitride layer 33 is retained over the active regions.

Figure 4C:
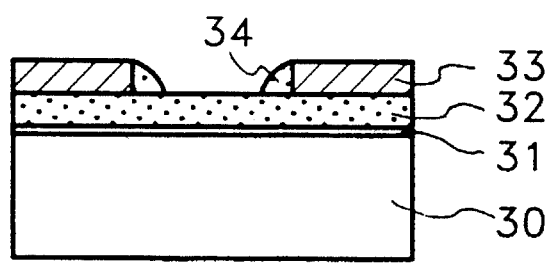

FIG. 4C illustrates a process for forming spacers 34. A polysilicon layer is deposited by CVD over the whole surface of the structure, then is anisotropically etched by a dry etching method, to form spacers 34 on the side walls of the remaining nitride layer 33. Here, the size of the spacer can be adjusted by adjusting the thickness of the nitride layer.

Figure 4D:
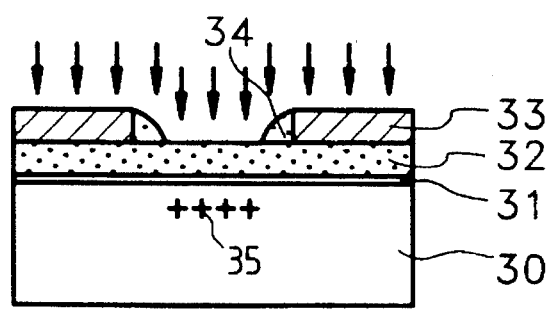

FIG. 4D illustrates a process for forming a channel stop region 35 which is formed by ion implanting an impurity having the same conductivity type as that of the substrate 30 using the spacers 34 as a mask.

As described above, if ion implantation into the field region is performed after forming the spacers 34, the doping density at the edges of the field region is lower than the center portion thereof, so that active region breakdown voltage and threshold voltage can be raised. Further, since high-density ion implantation can be performed, punch-through can be effectively prevented.

Figure 4E:
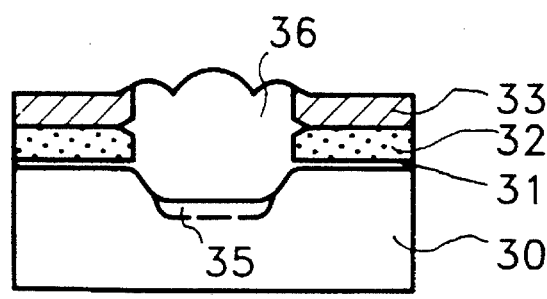

FIG. 4E illustrates a process for forming a field oxide layer 36. The field oxide layer 36 is thickly formed by oxidizing a portion on the silicon substrate 30 exposed between spacers 34. Here, when the polycrystalline silicon spacers 34 oxidize, the bird's beak effect at the edges of the field region hardly occurs. Also stress at the edges due to the nitride layer, is greatly reduced.

Figure 4F:
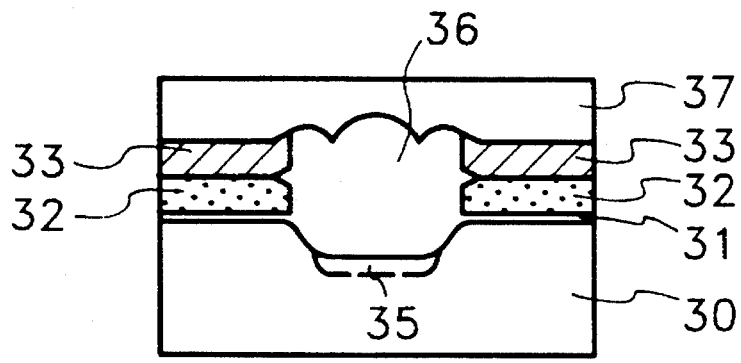

FIG. 4F illustrates a process for depositing an insulating layer 37 over the entire structure's surface to allow for subsequent full planarization of the field oxide layer's profile.

Figure 4G:
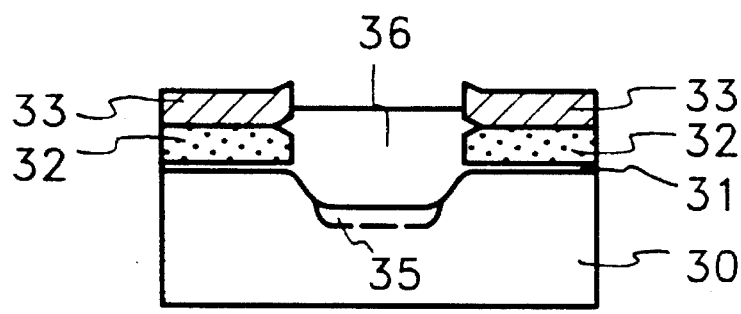

FIG. 4G illustrates an etchback process. The insulating layer 37 is anisotropically etched by RIE (Reactive Ion Etching), thereby planarizing the upper portion of the field oxide layer 36.

Figure 4H:
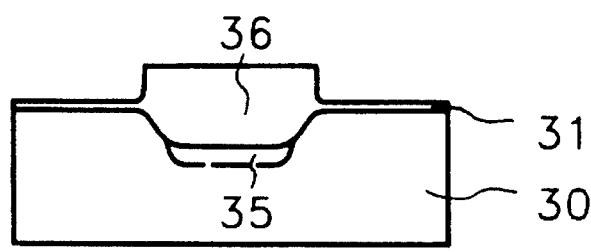

FIG. 4H illustrates a process for sequentially removing the nitride layer 33 and the polysilicon layer 32.

Figure 4I:
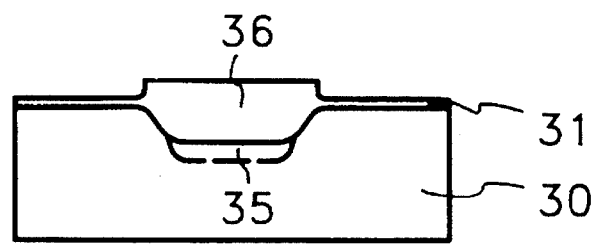

Afterwards, the field oxide layer 36 is again slightly etched by an etchback process. Finally, a greatly planarized isolation pattern is obtained, as illustrated in FIG. 4I.

FIG. 5A to 5I illustrate another embodiment of a process for forming a field oxide layer according to the present invention.

Figure 5A:
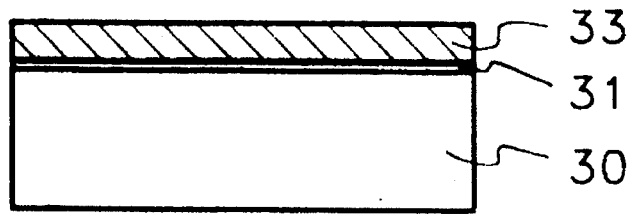
FIGS. 5A to 5I show another embodiment of a process for forming a field oxide layer according to the present invention.
Figure 5B:
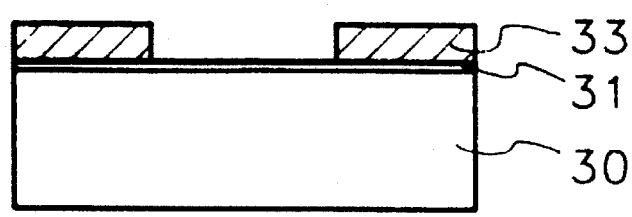
Figure 5C:
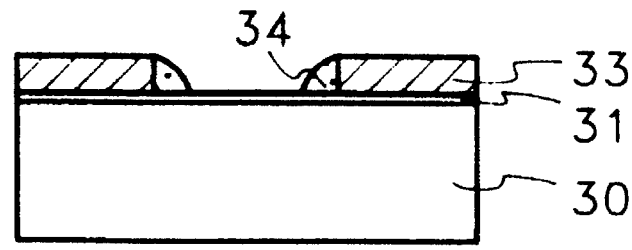
Figure 5D:
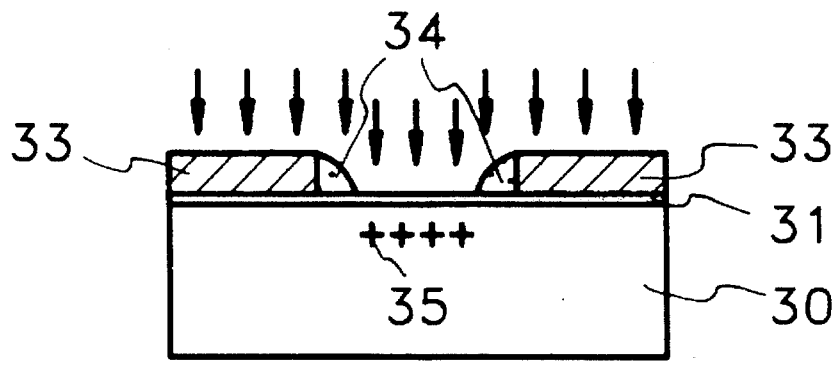
Figure 5E:
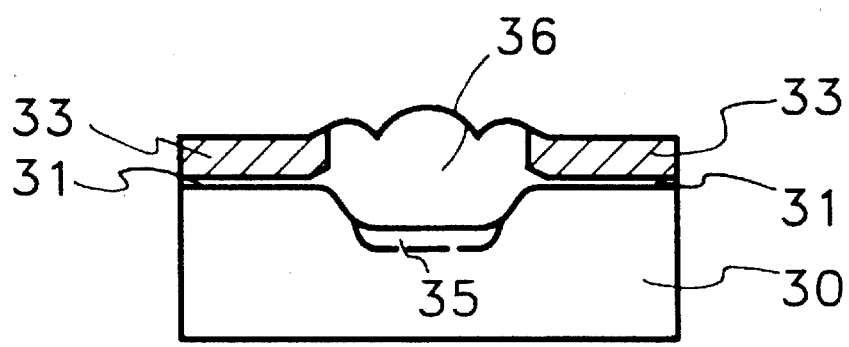
Figure 5F:
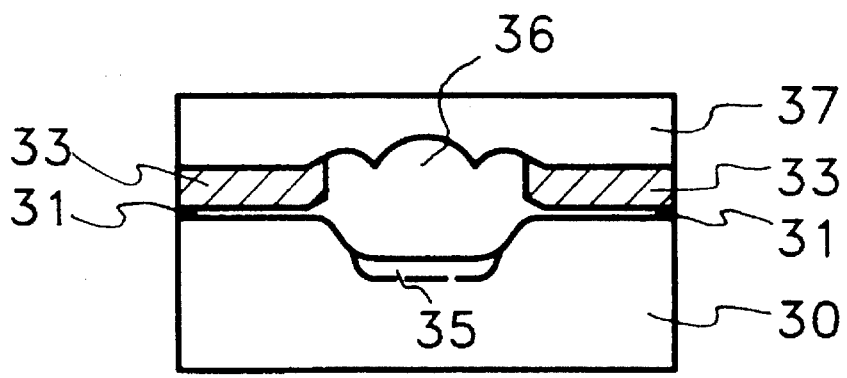

FIG. 5A illustrates a process for forming a pad oxide layer 31 and a nitride layer 33. The pad oxide layer 31 having a thickness of about 80 Å to 1000 Å is grown by thermal oxidation over a silicon substrate 30. A nitride layer 33 having a thickness of about 1000 Å to 4000 Å is successively deposited by CVD over the pad oxide layer 31.

The processes shown in FIGS. 5B to 5G are identical to those illustrated in FIGS. 4B to 4G.

Figure 5G:
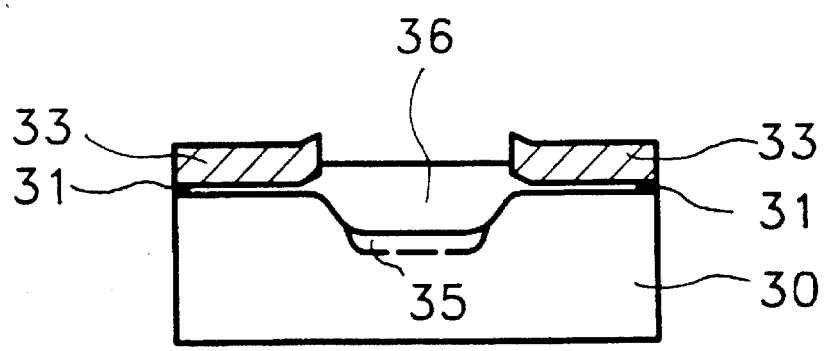
Figure 5H:
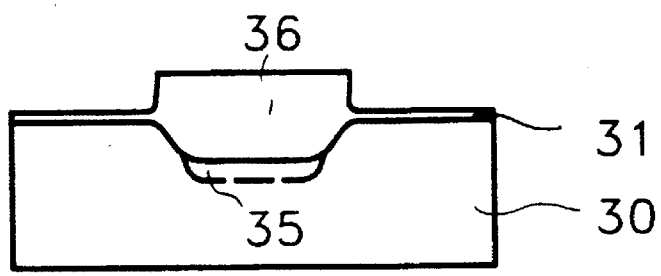

FIG. 5H illustrates a process for removing the nitride layer 33, after performing the process shown in FIG. 5G.

Figure 5I:
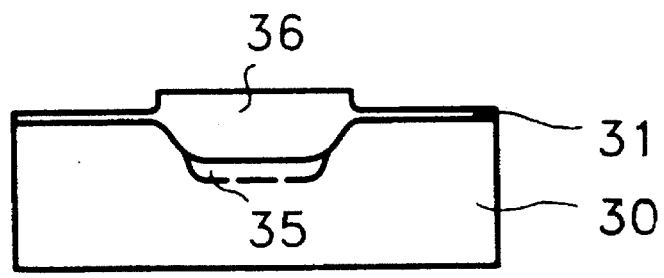

The process shown in FIG. 5I is identical to that illustrated in FIG. 4I.

As described above, since a field region is oxidized after forming a spacer at the side wall of a nitride layer, the size of the bird's beak at the edge of the field region can be decreased. Also, since the edges of a field oxide layer are in contact with a spacer made of a porous polysilicon layer rather than a nitride layer which has a densely packed structure, stress at the edges of the field oxide layer can be markedly decreased.

Further, since the ion implantation to the field region is performed after spacers are formed and using them as a mask, it is possible to prevent the lowering of the breakdown voltage, and still implant high dosages of ions into the field region. As a result, the present invention is advantageous in that punch-through is effectively prevented, and the threshold voltage is raised.

What is claimed is:

1. A method for forming a field oxide layer of a semiconductor integrated circuit device comprising the steps of:

thermally growing a pad oxide layer on a semiconductor substrate, and sequentially depositing a polysilicon layer and a nitride layer on said pad oxide layer;

removing said nitride layer over a field region to define active regions adjacent said field region;

forming spacers on the side walls of the remaining portions on said nitride layer;

doping an impurity into said substrate in said field region using said spacers as a mask;

growing a field oxide layer by thermally oxidizing the exposed portion of said substrate in said field region;

depositing an insulating layer over the whole surface of the resultant structure;

planarizing the upper portion of said field oxide layer by anisotropically etching said insulating layer;

removing said remaining nitride layer and polysilicon layer; and improving the step coverage of said field oxide layer by anisotropically etching the whole surface of the resultant structure.

2. A method for forming a field oxide layer of a semiconductor substrate integrated circuit device, as claimed in claim 1, wherein said spacers are made of a polysilicon.

3. A method for forming a field oxide layer of a semiconductor substrate as claimed in claim 1, wherein the size of said spacer is adjusted by the thickness of said nitride layer.

4. A method for forming a field oxide layer of a semiconductor substrate integrated circuit device as claimed in claim 3, wherein the thickness of said nitride layer is about 1000 Å to 4000 Å.

* * * * *

UNITED STATES PATENT AND TRADEMARK OFFICE
CERTIFICATE OF CORRECTION

PATENT NO. : 5,472,905
DATED : December 5, 1995
INVENTOR(S) : Weon-sik Paek et al.

It is certified that error appears in the above-indentified patent and that said Letters Patent is hereby corrected as shown below:

Col. 1, line 9, "integrated circuit," should be -- devices --; Col. 1, line 10, "device" should be -- integrated circuit --; Col. 1, line 33, "Whereafter" should be -- Thereafter --; <u>In the Claims:</u> Col. 6, line 14 (claim 2), delete "substrate"; same line, delete the comma; Col. 6, line 17 (claim 3), "substrate" should be -- integrated circuit device --; Col. 6, line 18 (claim 3), "spacer is" should be -- spacers are --; Col. 6, line 21 (claim 4), delete "substrate".

Signed and Sealed this

Twenty-eighth Day of May, 1996

Attest:

BRUCE LEHMAN

*Attesting Officer*  *Commissioner of Patents and Trademarks*